United States Patent
Leenders et al.

(10) Patent No.: US 6,366,013 B1
(45) Date of Patent: Apr. 2, 2002

(54) MATERIAL COMPRISING AN ANTI-REFLECTIVE COATING ON A FLEXIBLE GLASS SUBSTRATE

(75) Inventors: Luc Leenders, Herentals; Bartholomeus Verlinden, Tongeren; Jean-Pierre Tahon, Langdorp; Paul Lippens, Kortemark; Hugo Lievens, Zwijnaarde, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/267,676

(22) Filed: Mar. 15, 1999

Related U.S. Application Data

(60) Provisional application No. 60/078,283, filed on Mar. 17, 1998.

(51) Int. Cl.$^7$ .................................................. H01J 1/70
(52) U.S. Cl. ........................ 313/479; 313/478; 348/832
(58) Field of Search ................................. 313/479, 480, 313/473, 474, 478; 359/609, 586, 588, 585, 584, 580; 348/821, 823, 824, 825, 832

(56) References Cited

U.S. PATENT DOCUMENTS 5,270,858 A * 12/1993 Dickey ........................ 359/586
5,450,238 A * 9/1995 Bjornard et al. ............ 359/580
5,959,762 A * 9/1999 Bandettini et al. .......... 359/265
5,981,059 A * 11/1999 Bright et al. ................ 428/336

* cited by examiner

Primary Examiner—Nimeshkumar D. Patel
Assistant Examiner—Karabi Guharay
(74) Attorney, Agent, or Firm—Breiner & Breiner, L.L.C.

(57) ABSTRACT

A material is disclosed which is suitable for reducing the reflection of information displays such as a CRT, LCD, plasma tube, etc., and is characterised by an improved pencil hardness and excellent optical properties (lower average reflection, higher bandwidth). The anti-reflection material of the invention comprises an anti-reflective coating 20 and an optional top coat 10 on a flexible glass substrate 30 that is capable of being wound around a cylindrical core having a radius of 1.5 m. In a preferred method of the present invention the glass substrate 30 is provided with anti-reflective coating 20 using a continuous web coating process while being laminated to a polymer support 50 by using adhesive layer 40. Upon delamination (arrows 60) the adhesive layer 40 may remain fixed to glass substrate 30 (right embodiment of FIG. 1) or to polymer support 50 (left embodiment of FIG. 1). After said delamination the glass substrate 30 provided with anti-reflective coating 20 may be adhered to the front panel of an information display device.

12 Claims, 1 Drawing Sheet

MATERIAL COMPRISING AN ANTI-REFLECTIVE COATING ON A FLEXIBLE GLASS SUBSTRATE

RELATED APPLICATION

This application claims priority of U.S. Provisional Application No. 60/078,283 filed Mar. 17, 1998.

FIELD OF THE INVENTION

The present invention relates to a material comprising a flexible glass substrate provided with an anti-reflective coating and to methods for manufacturing said material and using said material for reducing the reflection of information display devices.

BACKGROUND OF THE INVENTION

In order to improve the perceptibility of the information displayed by devices such as television screens and computer monitors, the outer surface of the front panel of the display elements therein, such as cathode ray tubes (CRT's), liquid crystal displays (LCD's) and plasma tubes, may be provided with an anti-reflective (AR) coating. AR coatings are characterised by a very low reflectance (ratio of reflected light intensity versus incident light intensity) over the whole visible spectrum, roughly from about 400 to about 700 nm. Their performance may be quantified by the so-called bandwidth (BW) which is defined as the ratio of the longer ($\lambda_L$) and shorter ($\lambda_s$) limits of the wavelength range in which the reflectance is not higher than 1% (BW=$\lambda_L/\lambda_s$).

Suitable AR coatings are multi-layer stacks which may be applied onto a display surface by various coating techniques such as spin coating or vacuum deposition methods, e.g. magnetron sputtering, and said coating may be performed either directly on the display surface or indirectly. The indirect method typically involves the lamination to the display surface of an AR sheet which comprises a transparent flexible substrate provided with an AR coating.

The first alternative mentioned above (coating directly onto the display surface) is considered less favourable than the second (lamination of an AR sheet) because of the following drawbacks: (i) if the coating for some reason does not comply with the specified quality, then the AR coating as well as the display device itself is lost; and (ii) the display surface needs to be polished before coating in order to remove surface marks originating from the die casting process used for manufacturing the display device. Surface marks on CRT tubes are cavities having typical dimensions in the range from 90 to 190 μm. In the indirect, i.e. lamination method these marks are filled up with the adhesive layer used to laminate the AR sheet to the display surface and are invisible if the refractive index of the adhesive matches the refractive index of the display panel. Therefore the latter method does not require the step of display surface polishing, thereby eliminating an expensive process.

In addition to both problems mentioned above, the direct coating of display surfaces is hard to implement if a vacuum deposition technique is chosen as coating method because of the following difficulties: (i) as each display is an individual element, the coating is a batch process which is inherently characterised by a much higher complexity and cost than continuous production methods (e.g. batch vacuum systems need load locks); and (ii) non-planar display panels such as in CRT's require geometrical modifications of the vacuum deposition equipment in order to guarantee a uniform coating on the curved surface.

The above problems associated with direct AR coating of display surfaces can be solved by the alternative method of laminating to the front surface of a display panel an AR sheet comprising a flexible plastic substrate and an AR coating. However, in spite of their many advantages, AR sheets known from the prior art still need improvement especially when used for CRT's. The substrate used in an AR sheet is typically a very thin (<0.3 mm) plastic substrate consisting of poly(ethylene terephtalate) (PET), polycarbonate or cellulose-triacetate, and is therefore characterised by a low indentation hardness, expressed herein as pencil hardness. Pencil hardness may be measured by drawing one or more lines on the surface of a material with pencils of varying hardness using a predetermined force. A material having a pencil hardness equal to e.g. 3H means that a pencil having hardness 3H is not capable of scratching the surface of the material, whereas a pencil of hardness 4H does make scratches on the surface. Pencil hardness values referred to herein were measured by drawing 5 tracks of at least 1 cm using a force of 1 kg and then establishing by visual control which pencil hardness is required to scratch the surface. More details about measuring pencil hardness may be found in ASTM specification D 3363.

Due to the low pencil hardness of the plastic substrate of an AR sheet, the AR coating which typically consists of brittle inorganic materials may be damaged easily upon a sharp local pressure. To improve its mechanical strength (indentation strength), the plastic substrate may be provided with an organic hard-coat prior to vacuum deposition of the AR coating. A suitable hard-coat consists of a UV-cured acrylate and has a thickness of 3–5 μm. This treatment may increase the pencil hardness of a PET substrate to 2–3H. However, the pencil hardness of a CRT panel itself is much higher (8–9H) and therefore the application of an AR sheet consisting of a flexible plastic substrate, a hard-coat and an AR coating to a CRT panel reduces the overall hardness of the display surface.

Still other problems are associated with the use of plastic substrates and organic hard-coats. The refractive indices of a plastic substrate and a hard-coat may differ significantly from the refractive index of glass (typical value of PET is about 1.60, whereas that of glass used in display panels ranges from 1.45 to 1.54; all values at 510 nm). As a result, the reflectance of these plastic AR sheets is higher than what would be obtainable by direct AR coating. Some additional reflectance will further arise from the substrate/adhesive interface as the refractive index of the adhesive is preferably matched to the glass display panel and thus also differs significantly from the refractive index of the plastic substrate. These characteristics of plastic AR sheets limit the lowest obtainable value of the average reflectance in the visible spectrum and also limits the bandwidth and may cause clearly visible Newton rings.

Finally, the inorganic AR coating is difficult to adhere to cured acrylates and though highly crosslinked hard-coats are preferred for better hardness, such hard-coats are incompatible with high adhesion strength even if a plasma pretreatment is applied as a chemical surface functionalisation prior to vacuum deposition of the inorganic AR coating.

Due to the above problems associated with the use of AR sheets comprising plastic substrates and hard-coats, AR-sheets having class substrates may be preferred. Since a glass substrate has the same pencil hardness as the (glass) surface of a display panel, a hard-coat is not necessary. The continuous production of sputter-coated glass sheets is disclosed in e.g. U.S. Pat. No. 3,904,506; U.S. Pat. No. 3,945,911 and U.S. Pat. No. 4,009,090. A flexible substrate is however preferred when one prefers the use of a classical web coating process for depositing an AR coating. In addition, a flexible substrate is needed for application on CRT displays in view of the curved geometry of the display surface.

EP-A 716,339 and WO 87/06626 have each disclosed that thin glass substrates having the right physical characteristics are flexible enough to be wound up on a coil and wound off from said coil and thus may be coated with various layers in a continuous web coating process. Though the solutions disclosed by both the latter patent applications indeed make it possible to obtain coatings on a flexible glass substrate, the probability of fracturing the thin glass substrate during handling and coating is still significant. In addition to productivity loss, glass fracture may cause serious damage to the vacuum pumps when using vacuum deposition techniques. The probability of the presence of glass fragments in the vacuum chamber thus should be eliminated completely in order to make the process suitable for industrial application.

SUMMARY OF THE INVENTION

It is an object of the present invention to provide a flexible anti-reflection material that is suitable for being laminated to the outer surface of the front panel of an information display device and is characterised by a high pencil hardness and excellent optical characteristics such as a low average reflectance in the visible spectrum and a high bandwidth. This object is realised by a web- or sheet-like material comprising an anti-reflective coating and a glass substrate that is capable of being wound around a cylindrical core having a radius of 1.5 m.

It is another object of the present invention to provide a method for applying an anti-reflective coating on a flexible glass substrate by a continuous vacuum deposition technique without the risk of damage by glass fracture. This object is realised by a method for making an anti-reflective material comprising the steps of (i) making a laminate consisting of a glass substrate, a support and an optional adhesive layer between said substrate and support, said glass substrate being capable of being wound around a cylindrical core having a radius of 1.5 m;

(ii) providing an anti-reflective coating on the glass side of said laminate by vacuum deposition;

(iii) optionally providing a top coat on said anti-reflective coating.

Specific features for preferred embodiments of the invention are disclosed in the dependent claims. Further advantages and embodiments of the present invention will become apparent from the following description.

DETAILED DESCRIPTION OF THE INVENTION

Figure 1:
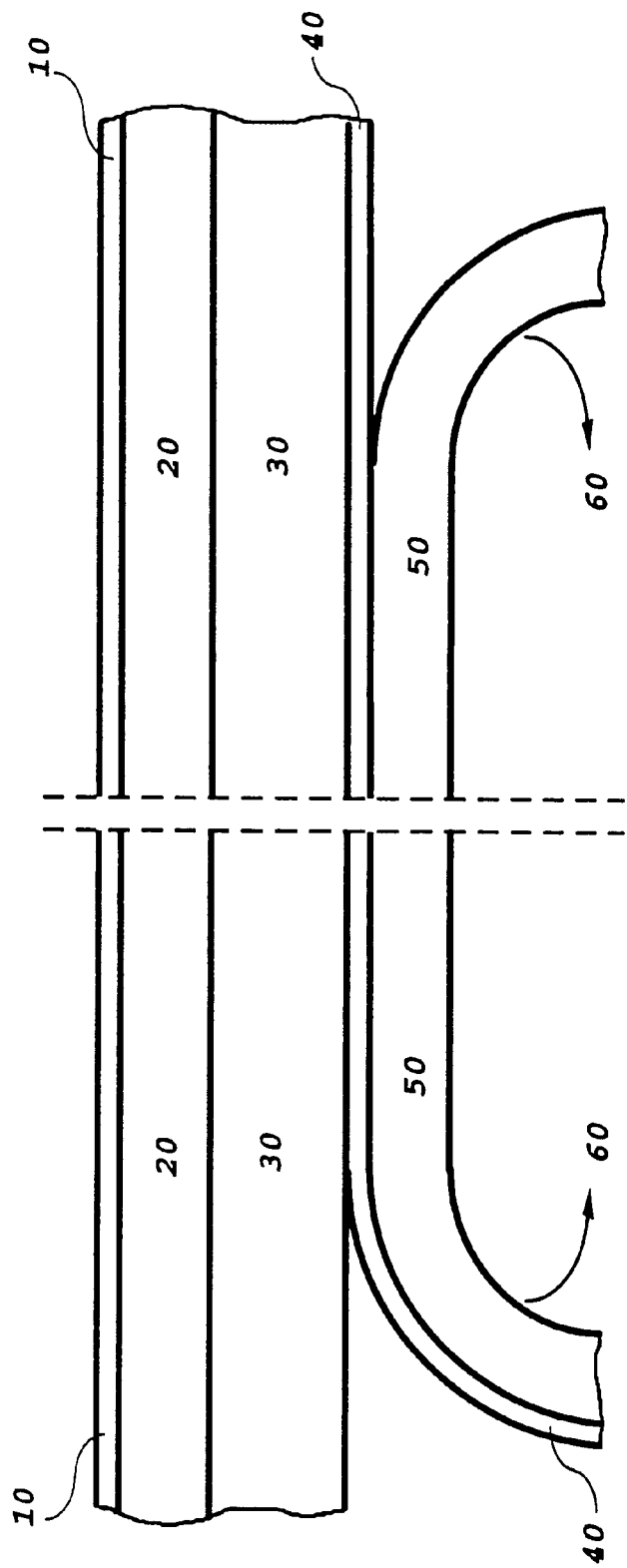
FIG. 1 schematically shows a cross-section of two preferred embodiments of an anti-reflection material according to the present invention (thickness of layers not drawn to scale).

According to the present invention, an anti-reflective coating is provided on a flexible glass substrate. The material thus obtained is referred to herein as "AR material". The AR material of the present invention is suitable for being laminated to the outer surface of the front panel of an information display device. Said surface may be briefly referred to herein as "display surface" and said panel as "display panel". The AR material of the present invention may be provided as a web wound up on a roll or may be cut in sheets. When supplied as sheets, an interleaf may be provided as protective sheet or spacer between two consecutive AR sheets. When supplied on roll, a web interleaf may be wound up on said roll together with the AR material of the present invention.

The AR material of the present invention has improved pencil hardness and excellent optical characteristics such as a low average reflectance in the visible spectrum and a high bandwidth. A flexible glass substrate is superior to a plastic substrate in many other aspects. Glass shows high thermal stability, is hard, very resistant to chemicals and an efficient barrier for moisture, solvents and oxygen. In addition to its high transparency, the optical characteristics of glass make it an ideal substrate for being provided with an AR-coating and then laminated to a display surface.

A glass substrate that is suitable for being used in the present invention has been described in EP-A 716,339. A preferred glass substrate is characterised by a failure stress (under tensile stress) higher than $1 \times 10^7$ Pa, an elasticity modulus (Young's modulus) lower than $1 \times 10^{11}$ Pa and a thickness not higher than 1.2 mm, preferably lower than 0.5 mm, more preferably lower than 0.3 mm and most preferably lower than 120 $\mu$m. Such glass can be wound on a cylindrical core having a radius of 1.5 m without breaking. The front panel of a typical CRT has a radius of about 1.5 m, so the AR element of the present invention may be laminated to the outer surface of said panel without breaking. A flexible glass substrate may be wound around a cylindrical core of a much lower radius provided that the thickness of the glass is lower, e.g. a glass of thickness 30 $\mu$m may be wound around a cylindrical core having a radius of 10 cm without breaking. It is self-evident for the skilled person that a flexible glass substrate which is capable of being wound around a cylindrical core having a radius of 10 cm without breaking can also be wound around a core of a radius equal to 1.5 m without breaking.

Flexible glass according to the above specifications is commercially available from Desag, a Schott group company, as types AF45 and D263 with a thickness ranging from 30 $\mu$m to 1.1 mm and from Corning as types 7059F and 1737F with a thickness of 0.7 mm and 1.1 mm. The flexible glass substrate is preferably made of sodium silicate or borosilicate but also chemically strengthened glass can be used. Chemically strengthened glass is glass wherein the original alkali ions near both surfaces are at least partially replaced by an alkali ion with a larger radius. At the surface of strengthened sodium lime silica glass sodium is replaced at least partially by potassium and at the surface of strengthened lithium lime silica glass lithium is replaced at least partially by sodium. More details about chemical strengthening of glass are given in e.g. "Glass Technology", Vol. 6, No. 3, page 90–97, June 1965. Thin, chemically strengthened glass and the use thereof has been disclosed in European Patent Application no. 96,202,968, filed on Oct. 24, 1996 and a process for producing chemically hardened glass in European Patent Application no. 97,201,255, filed on Apr. 30, 1997.

The glass substrate may be provided with a silicate sol/gel coat having preferably a thickness of at least 1 $\mu$m, more preferably a thickness of at least 10 $\mu$m. Other additional layers provided on the glass substrate or treatments of said glass substrate may be helpful in the methods described herein, e.g. it may be useful to apply a plasma-treatment as chemical surface functionalization prior to vacuum deposition.

The glass substrate used in the present invention may be provided on roll and may be unwound from said roll for being coated in a web coating process. The inventors of the present application have established that the probability of glass fracture is significant while coating or handling the flexible glass substrate, which makes it unsuitable for being coated by vacuum deposition techniques on an industrial scale. According to a highly preferred embodiment of the present invention, a flexible glass substrate can be provided with an AR coating by vacuum deposition techniques without risk of damage by glass fracture by applying it as a laminate. The probability of glass fracture is considerably lower when the side of the glass substrate, opposite to the side to be provided with an AR coating, is laminated to a self-supporting layer, referred to herein as "support", so as to distinguish it from the flexible glass "substrate". Said support acts as a protecting layer for the glass substrate. Even when the flexible glass substrate would break during vacuum deposition, the glass fragments remain fixed to the support and can not be drawn into the vacuum pump. In addition, said support prevents that the glass substrate is scratched during coating.

The support, which according to the present invention may be laminated to the flexible glass substrate, may be paper, metal, etc., but is preferably an organic polymer and such support may be referred to herein as "polymer support". Suitable polymer supports are e.g. cellulose acetate film, poly(vinyl acetal) film, polystyrene film, polycarbonate film, polyethylene film, polypropylene film, polyacrylonitrile, polybutadiene, a polyester or a vinyl chloride polymer. The term "polymer" used herein includes the homopolymer as well as any copolymer containing one or more of the following comonomers : vinylidene chloride, vinyl acetate, acrylonitrile, styrene, butadiene, chloroprene, dichlorobutadiene, vinyl fluoride, vinylidene fluoride and trifluorochloroethylene. A highly preferred organic polymer for use as support in the AR material of the present invention is poly(ethylene terephtalate) (PET).

The AR material of the present invention is now illustrated by two highly preferred embodiments shown in FIG. 1. A flexible glass substrate 30 provided at one side with an AR coating 20 is laminated at the opposite side to a support 50. Preferably, an adhesive layer 40 is present between glass substrate 30 and support 50. An optional top coat 10 may protect the AR coating 20 from contamination by dust, stain, finger prints, glass cleaner, solvents, etc. The adhesive layer 40 is preferably a non-permanent adhesive layer, meaning that support 50 may be removed from the glass substrate 30 by delamination (indicated by arrows 60). After delamination the side of glass substrate 30, opposite to AR coating 20, can be adhered to a display surface. When the AR material of the present invention is supplied as sheets, cutting is preferably carried out before delaminating the support from the glass substrate.

Upon delamination, the adhesive layer 40 may remain fixed to glass substrate 30 (right embodiment of FIG. 1) or to polymer support 50 (left embodiment of FIG. 1). If the adhesive layer is still present on the flexible glass substrate after delamination, then the same adhesive layer may be used to adhere the AR material to a display surface. Such an embodiment may be obtained by using a polymer support having a low affinity for the adhesive layer such as a PET support that is coated with silicones. When the adhesive layer is removed together with the support upon delamination, then the display surface may be provided with an adhesive, e.g. by spin-coating or by applying the adhesive in sheet form and then that adhesive may be used to adhere the AR material to the display surface. The adhesive between the glass substrate and the display surface is preferably characterised by a refractive index value close to the material of the display panel.

Alternatively, the polymer support may not be delaminated from the glass substrate and the AR coated laminate thus may be adhered to the display surface as a whole. Suitable polymers for use in the laminate of the latter embodiment preferably have a refractive index close to that of glass, i.e. in the range from about 1.45 to about 1.54, so that the optical properties of the AR material are compatible with those of the display panel. Examples of such polymers are given in "Polymer Handbook", third edition, J. Wiley & Sons (1989), p. 454–455.

Methods for laminating the glass substrate to the support are well known. Both layers may be laminated without the use of an adhesive layer by so-called vacuum lamination. The use of an adhesive layer, tape or glue followed by the application of heat or pressure is however preferred. The adhesive layer may be applied either to the glass substrate, to the support, or to both and may be shielded by a stripping layer, which is removed just before lamination. Lamination can be effected manually but preferably is effected in a laminating means called a laminator. A typical laminator comprises a pair of two heatable rollers, having an adjustable pressure and moving at a fixed or an adjustable speed. The lamination with a laminator is effected by bringing the glass substrate and the support in close contact with each other. An adhesive may be sandwiched between both and said sandwich is then put through between the rollers of the laminator.

The adhesive layer may be a temperature-sensitive adhesive (TSA) layer, a pressure-sensitive adhesive (PSA) layer or an adhesive that is curable by ultraviolet radiation (UVA), by exposure to an electron beam or is thermally curable. Polymers in typical water-coatable TSA's are latices having a glass transition temperature (Tg) below 80° C. Because the temperature of the laminate may increase while coating by a vacuum deposition technique such as sputter-coating, suitable TSA's preferably contain polymers having a Tg that is at least 10° C. higher than the highest temperature of the laminate during vacuum deposition. For similar reasons, a PSA or a curable adhesive is preferred which is thermally stable up to a temperature of 120° C. or even 150° C.

Preferred PSA layers for use in the present invention comprise one or more tacky elastomers, e.g. block copolymers of styrene/ isoprene, styrene/butadiene rubbers, butyl rubbers, polymers of isobutylene and silicones. Particularly preferred are natural rubbers and acrylate copolymers as disclosed in U.S. Pat. No. 3,857,731. Said acrylate polymers preferably consist of 90 to 99.5% by weight of at least one alkyl acrylate ester and 10 to 0.5% by weight of a monomer selected from the group consisting of substantially oil-insoluble, water-soluble, ionic monomers and maleic anhydride. The acrylate ester portion preferably consists of those monomers that are hydrophobic, water emulsifiable, substantially water insoluble and which as homopolymers generally have a glass transition temperature of 20° C. or less. Examples of such monomers are isooctyl acrylate, 4-methyl-2-pentyl acrylate, 2-methylbutyl acrylate and sec-butyl acrylate. Other examples of suitable monomers are e.g. trimethylamine methacrylamide, trimethylamine p-vinylbenzimide, ammonium acrylate, sodium acrylate, N,N-dimethyl-N-1-(2-hydroxypropyl)amine methacrylamide and maleic anhydride. The PSA preferably has a continuous-coat (100% coverage) peel adhesion value, when applied to untreated paper, between 0.1 and 10 N/cm width.

The PSA may further contain a binder. Suitable binders are inert towards the pressure-sensitive adhesives, i.e. they do not chemically attack the pressure-sensitive adhesives. Examples of such binders are nitrocellulose, urethanes, gelatin, polyvinyl alcohol, etc. The amount of binder should be chosen such that the pressure-sensitive adhesives laminate effectively. Preferably the amount of binder is lower than 2.5 parts by weight with respect to the pressure-sensitive adhesives and more preferably lower than 0.6 parts by weight.

UVA's can be broadly classified into two categories: free radical polymerised and cationic polymerised. Polymers formed by free radical polymerisation are generally based upon acrylic monomers or oligomers which are converted to high molecular weight polymers by crosslinking upon exposure to ultraviolet radiation. The UVA preferably contains a photo-initiator such as a benzophenone-amine, alpha-substituted acetophenone or amino-acetophenone. The addition of isopropyl thioxanthone is known to have a sensitising effect on the photo-initiator and to shift the useful exposure to near visible light, which is important for user safety. Other ingredients typically used in UVA's are flexibilisers such as thermoplastics solvated or dispersed in the acrylic material, adhesion promoters such as polyethylene or polypropylene, and fillers. Additional information on UVA's can be found in RadCureLetter No.5 (1996) and Tappi Journal, January 1992, p. 121–125. Electron beam curable adhesives work in principle according to the same mechanism as UV-curable adhesive, however without requiring a photo-initiator.

Examples of suitable adhesives for use in the present invention are Solucryl (trade name by UCB, Belgium), preferably Solucryl types 355 HP, 380 and 825D; Rhodotak (trade name by Rhone-Poulenc); Acronal (trade name by BASF); Duro-Tak 380-2954 (trade name by National Starch & Chemical B.V.); PERMAprint type PP2011 and PERMAgard type PG7036 (trade names by Varitape N.V., Belgium).

The AR coating of the material of the present invention may be any coating capable of decreasing the visible light reflection of the material. Preferably said AR coating is a stack of layers. In order to obtain optimum optical properties such as low reflectance and high bandwidth, the stack may combine materials having very low and very high refractive indices. Practically, silicon dioxide is used as material with a very low refractive index, and titanium dioxide is used as material with a very high refractive index.

Suitable examples of AR stacks for use in the material of the present invention are described in U.S. Pat. No. 5,270,858, e.g. an AR stack consisting of four layers (substrate/$TiO_2/SiO_2/TiO_2/SiO_2$ and substrate/$TiO_2/SiO_2/ZnO/SiO_2$) and an example of a five-layer AR stack (substrate/$TiO_2/SiO_2/ZnO/TiO_2/SiO_2$). Suitable five-layer AR stacks have also been described in U.S. Pat. No. 5,216,542: the layer closest to the substrate consists of $SnO_x$, $ZrO_2$, $ZnO$, $Ta_2O_5$, $NiCrO_x$, $TiO_2$, $Sb_2O_3$, $In_2O_3$, or a mixtures of these oxides. The next layer is TiN or ZrN. The third layer is identical to the first, except for the layer thickness. The next layer is TiN or ZrN and the upper layer is $SiO_2$, $Al_2O_3$, AlSi oxide, NiSi oxide, MgO, $MgF_2$, the oxyfluorides of the latter group or a mixture of these oxides or oxyfluorides.

EP-A 753,762 describes examples of two-layer AR stacks with an upper layer of $SiO_2$ or $MgF_2$ and a lower layer (next to the substrate) which is electrically conducting and light absorbing such as $TiN_x$, $TiN_x$-W, $TiN_xO_y$, $ZrN_x$, $ZrO_xN_y$ or a mixture of $TiN_xO_y$ and $ZrO_xN_y$, indium-tin oxide (ITO) or Au-doped ITO. U.S. Pat. No. 5,523,649 describes layers consisting of gels of Si, Al or Ti of which the refractive index may be adjusted by different ageing. Other examples of suitable electrically conducting and light absorbing AR stacks for use in the material of the present invention have been described in WO 93/04,993, e.g. the four-layer stack substrate/$TiN/SnO_2$ or $TiO_2$ or $SiO_2/TiN/SiO_2$. WO 96/18.917 describes two-layer light absorbing stacks as AR materials for displays. The lower, light absorbing layer (next to the substrate) is TiN, ZrN or HfN and the upper layer is $SiO_2$. A $Si_3N_4$ layer may be added as oxygen barrier between said lower and upper layer.

A preferred example of a coating suitable for the AR material of the present invention is the so-called broadened V-coat, flattened V-coat or Vermeulen coat. This AR coating comprises a stack consisting of four material layers. The first layer which is located farthest from the glass substrate, is a quarterwave layer, which means that it has a optical thickness which is comprised between 0.2 and 0.3 $\lambda_O$, typically of about 0.25 $\lambda_O$. The optical thickness is expressed as a fraction of $\lambda_O$, about 510 nm, the reciprocal mean of the boundary wave-lengths limiting the visual wavelength region, viz. from 400 nm to 700 nm. The second layer of said Vermeulen coat consists of a material with an optical thickness which is comprised between 0.4 and 0.6 $\lambda_O$, typically of about 0.5 $\lambda_O$ (a halfwave). The third and fourth layers, located closest to the glass substrate, are very thin material layers having a typical optical thickness of about $\lambda_O/8$ and $\lambda_O/16$ respectively. A suitable V-coat is described in U.S. Pat. No. 5,450,238: substrate/$In_2O_3$ or $SnO_2$ or $ZnO$ or ITO or $TiO_2/SiO_2/TiO_2$ or $Nb_2O_5/SiO_2$.

The AR coating used in the present invention may also be a so-called modified Vermeulen coat, which has a much lower electrical resistance than the above. The modification is obtained by replacing a titanium dioxide layer (partially) by electrically conductive material layers such as e.g. In- or Al-doped zinc oxide, Sb- or F-doped tin oxide, Sn doped cadmium oxide, or indium-tin oxide layers. An example has been described in U.S. Pat No. 5,270,858.

Said replacement of titanium dioxide however may deteriorate the optical properties of the AR coating because the refractive index of ITO or the above mentioned oxides is much lower that that of $TiO_2$. In addition, the electrical conductivity of a modified Vermeulen coating may be insufficient to render the coating suitable for anti-static or EMI (Electro-Magnetic Interference) shielding applications, e.g. as coating for CRT's. Another drawback of a modified Vermeulen coating is that the electrically conducting layer is not adjustable as the optical thickness of the layers should obey exactly the above design specifications.

Therefore, a highly preferred embodiment of the present invention comprises an AR coating comprising a stack of five material layers as described in European Patent Application no. 97,203,335, filed on Oct. 29, 1997. The first layer, located farthest from the substrate, consists of a material with a refractive index about equal to the refractive index of the glass substrate, and has an optical thickness which is comprised between 0.2 and 0.3 $\lambda_O$, typically of about 0.25 $\lambda_O$ (a quarterwave). The second layer in the coating of this embodiment consists of a material with a refractive index which is greater than about 2.2, and has an optical thickness which is comprised between 0.4 $\lambda_O$ and 0.6 $\lambda_O$, typically of about 0.5 $\lambda_O$ (a halfwave). The third layer consists of an electrically conductive material, and will be characterised in detail below. The fourth layer consists of a material with a refractive index which is about the same as the refractive index of the first layer, and has an optical thickness of less than about 0.1 $\lambda_O$, typically comprised between 0.05 $\lambda_O$ and 0.15 $\lambda_O$. The fifth layer, closest to the substrate, consists of a material with a refractive index which is about the same as the refractive index of the second layer, and has an optical thickness which is comprised between 0.025 $\lambda_O$ and 0.1 $\lambda_O$, typically of about 0.05 $\lambda_O$.

The third material layer in the highly preferred coating stack described above consists of an electrically conductive material, giving the AR coating the desired electrical conductivity. This layer is a so-called "dummy layer", which means that its thickness has no or very little influence on the optical properties of the coating. By changing the thickness of this dummy layer, the electrical conductivity of the coating can be adjusted within a broad range, without influencing the optical properties of the coating. A preferred material for said dummy layer is ITO (defined above). By varying the thickness of the ITO dummy layer between 5 and 50 nm, and preferably between 20 and 40 nm, the electrical sheet resistance of the coating can be adjusted between 25 and 2000 #/sq, without influencing the optical properties of the coating. For application e.g. on cathode ray tubes, the electrical sheet resistance of the coating is preferably very low, between 25 and 500 #/sq. The electrical sheet resistance is defined as the resistance of a conductor made from the coating, with a surface area of one square, and can be calculated as the ratio of the resistivity of the coating and the thickness of the coating.

It is an additional advantage of the coating of the latter embodiment that its colour is adjustable and reproducible. Since the optical properties of the proposed coating are not very sensitive to small changes in thickness of its constituting layers and/or in the stoichiometry of the materials, fine-tuning of the colour is possible.

The above AR coatings may be applied onto the glass substrate by a vacuum deposition technique, preferably by means of a single or double pass vacuum magnetron sputtering operation in a web coater having a vacuum chamber comprising:

(1) a section for unwinding and rewinding a laminate comprising a flexible glass substrate and a support as described above;

(2) target sections wherein the material layers constituting the AR coating are consecutively sputtered onto the glass side of said laminate;

(3) a central cooling drum on the surface of which the laminate moves through the target sections.

Different target types can be used for obtaining the AR coating. For example, rotatable or planar silicon, titanium, and In/Sn alloy (90/10 wt-%) targets can be used for reactive sputtering in an Ar/O$_2$ atmosphere. It is however preferred to sputter the titanium dioxide layers from a TiO$_x$ rotatable ceramic target.

A TiO$_2$/SiO$_2$/ITO/TiO$_2$/SiO$_2$ stack may be sputtered using a single pass operation, in which the above five layers are deposited onto the substrate, in five separate and consecutive target sections First the material layer which has to be closest to the substrate, the fifth layer, is sputtered from a rotatable TiO$_x$ target. In the next target sections, the fourth, third, second and first layers of the stack are consecutively sputtered, respectively from a rotatable silicon target, a planar indium/tin or ITO target, a rotatable TiO$_x$ target, and a rotatable silicon target.

Alternatively a double pass operation may be used, in which the two material layers to be deposited closest to the substrate (TiO$_2$–SiO$_2$) are sputtered during the first pass of the substrate through the target sections, and the remaining three material layers (ITO–TiO$_2$–SiO$_2$) are sputtered during the second pass. This implies that a double pass operation requires only three target sections.

It will be clear from the above description that each of the rotatable magnetrons can be replaced by a planar magnetron and viceversa.

After applying the AR layer(s), the AR material of the present invention is preferably provided with a top coat. This top coat is preferably very thin (2–4 nm) since a thicker layer may affect the anti-reflection properties of the material. The top coat may be coated from an organic solution of surface active agents using a dip- or spray-coating method. Other methods such as gravure coating or vacuum polymerisation are also suitable. Preferred surface active agents are fluorinated compounds such as a partially fluorinated amine or carboxylic acid or a fluorinated alkoxysilane as described in "Anti-smudge layer for AR-films on CRT's", Symposium Digest SID 1997, p.540. Said fluorinated alkoxysilane is preferably used in combination with a catalyst such as an amine, an acid or a phosphate. The solvent of the coating solution may be alcohol such as methanol or isopropyl alcohol or is preferably a fluorinated alkane such as perfluoro-octane.

EXAMPLES

The AR stack given in Table 1 was coated on a hard-coated PET film as substrate (comparative example). The hard-coat consisted of a highly cross-linked UV-cured acrylate and had a thickness of about 3.5 μm. In a second example, which is an embodiment according to the present invention, the same AR stack was coated on the glass surface of a laminate consisting of a PET support and a flexible borosilicate glass substrate, available from Desag as type D263 and having a thickness of 70 μm. The laminate was formed using a PSA Solucryl type 355 HP available from UCB, Belgium.

The comparative example had a bandwidth of 1.57, a photopic reflection of 0.35% and a pencil hardness of 2H, whereas the example according to the invention had a bandwidth of >1.6, a photopic reflection of <0.3% and a pencil hardness of 8H. Bandwidth and pencil hardness have been defined above. The photopic reflection is the convolution of the eye sensitivity and the reflectance plot, and is measured in the wavelength region from 380 to 780 nm using a standard illuminant D65 and the 2° observer defined by the Commission Internationale de l'Eclairage (CIE1931).

TABLE 1

| Layer | Material | Refractive Index | Optical Thickness |
|---|---|---|---|
|   | < Air >    |         |                |
| 1 | SiO$_2$    | ≧1.46   | 0.2593 $\lambda_o$ |
| 2 | TiO$_2$    | ≧2.35   | 0.4636 $\pi_o$     |
| 3 | ITO        | 2.03    | 0.1591 $\lambda_o$ |
| 4 | SiO$_2$    | ≧1.46   | 0.0962 $\lambda_o$ |
| 5 | TiO$_2$    | ≧2.35   | 0.0435 $\lambda_o$ |
|   | < Substrate > |      |                |

Having described in detail preferred embodiments of the current invention, it will now be apparent to those skilled in the art that numerous modifications can be made therein without departing from the scope of the invention as defined in the appending claims. The AR sheets of the present invention can be applied on the outer surface of the front panel of information display devices, e.g. CRT's, flat-panel displays such as LCD's, electrochromic displays, electroluminescent displays and plasma tubes. They are also applicable to architectural glass, oven windows, shop windows, picture frames, etc., which may all be regarded as information displays in the broader sense.

What is claimed is:

1. A web- or sheet-like material comprising an anti-reflective coating and a glass substrate that is capable of being wound around a cylindrical core having a radius of 1.5 m, wherein said material further comprises a support which is laminated to the glass substrate at a side opposite to the anti-reflective coating and wherein the support consists essentially of an organic polymer support.

2. Material according to claim 1 wherein said glass substrate has a thickness lower than 0.5 mm.

3. Material according to claim 1 wherein the anti-reflective coating is a stack comprising four material layers, respectively designated as the first, second, third and fourth layer, starting from the layer located farthest from the glass substrate, and wherein said first and third layer consist essentially of silicon dioxide, and said second and fourth layer consist essentially of titanium dioxide.

4. Material according to claim 1 wherein the anti-reflective coating is a stack comprising four material layers, respectively designated as the first, second, third and fourth layer, starting from the layer located farthest from the glass substrate, and wherein said first layer has an optical thickness of about a quarterwave ($\lambda_O/4$), and wherein said second layer has an optical thickness of about a halfwave ($\lambda_O/2$), and wherein said third layer has an optical thickness of about $\lambda_O/8$, and wherein said fourth layer has an optical thickness of about $\lambda_O/16$, $\lambda_O$ being about 510 nm.

5. Material according to claim 3 or 4 further comprising an additional layer between said second and third layer, said additional layer consisting essentially of indium-tin oxide.

6. Material according to claim 1 further comprising a top coat (10) applied on the anti-reflective coating.

7. Material according to claim 1 further comprising an adhesive layer between the glass substrate and the support.

8. Material according to claim 7 wherein the adhesive layer is capable of remaining fixed to the glass substrate upon delamination.

9. Material according to claim 7 wherein the adhesive layer is capable of remaining fixed to the support upon delamination.

10. An information display device comprising a display element, said display element having a front panel with an outer surface, wherein a material according to claim 1 is applied on said outer surface.

11. Device according to claim 10 wherein the display element is a cathode ray tube and the outer surface is a curved surface.

12. Device according to claim 10 wherein the display element is a flat panel display and the outer surface is a flat surface.

* * * * *

UNITED STATES PATENT AND TRADEMARK OFFICE
CERTIFICATE OF CORRECTION

PATENT NO. : 6,366,013 B1
DATED : April 2, 2002
INVENTOR(S) : Luc Leenders et al.

It is certified that error appears in the above-identified patent and that said Letters Patent is hereby corrected as shown below:

Title page,
"[73] Assignee: Agfa-Gevaert, Mortsel (BE)" should read
-- [73] Assignee: Agfa-Gevaert, Mortsel (BE) and N.V. Bekaert S.A., Zwevegem (BE) --.

Column 9,
Line 54, insert a -- . -- after "sections".

Column 10,
Line 3, "viceversa" should read -- vice-versa --.

Column 11,
Line 7, after "support", insert -- is a self-supporting layer and --.
Line 8, after "polymer" delete "support".

Signed and Sealed this

Twenty-sixth Day of November, 2002

*Attest:*

*Attesting Officer*

JAMES E. ROGAN
*Director of the United States Patent and Trademark Office*